US011221660B2

United States Patent
Walker

(10) Patent No.: US 11,221,660 B2
(45) Date of Patent: Jan. 11, 2022

(54) FAULT DETECTION BASED ON COMPARING INPUT CURRENT AND MOVING AVERAGE INPUT CURRENT

(71) Applicant: HEWLETT PACKARD ENTERPRISE DEVELOPMENT LP, Houston, TX (US)

(72) Inventor: William James Walker, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 230 days.

(21) Appl. No.: 16/264,017

(22) Filed: Jan. 31, 2019

(65) Prior Publication Data
US 2020/0249736 A1    Aug. 6, 2020

(51) Int. Cl.
*G06F 1/28*    (2006.01)
*G01R 31/40*    (2020.01)
*G06F 1/30*    (2006.01)

(52) U.S. Cl.
CPC .............. *G06F 1/28* (2013.01); *G01R 31/40* (2013.01); *G06F 1/30* (2013.01)

(58) Field of Classification Search
CPC .............. G06F 1/28; G06F 1/30; G01R 31/40
See application file for complete search history.

(56) References Cited

U.S. PATENT DOCUMENTS

| 2012/0178992 A1* | 7/2012 | Fujimoto | H04N 7/183 600/109 |
| 2012/0197085 A1* | 8/2012 | Kato | A61B 1/00124 600/127 |
| 2013/0249397 A1 | 9/2013 | Chandran et al. | |
| 2015/0061904 A1* | 3/2015 | Lee | H03M 1/002 341/118 |

OTHER PUBLICATIONS

Tektronix, "Active Power Factor Correction Verification Measurements with an Oscilloscope," Apr. 2016, pp. 1-12.
On Semiconductor, "Compensating a PFC Stage," 2009, pp. 1-47.

* cited by examiner

*Primary Examiner* — Scott Bauer
(74) *Attorney, Agent, or Firm* — Hewlett Packard Enterprise Patent Department

(57) ABSTRACT

An example power supply for supplying electrical power to an electronic device includes converters to convert an input power signal into an output power signal, and a controller. The controller is to periodically measure an input current being drawn from the input power signal, periodically determine a moving average of the input current, and periodically compare the moving average of the input current to the present input current. The controller identifies that a fault may have occurred in response to the present input current exceeding the moving average by a threshold amount. The controller shuts down supply of power to the electronic device responsive to identifying the fault.

12 Claims, 7 Drawing Sheets

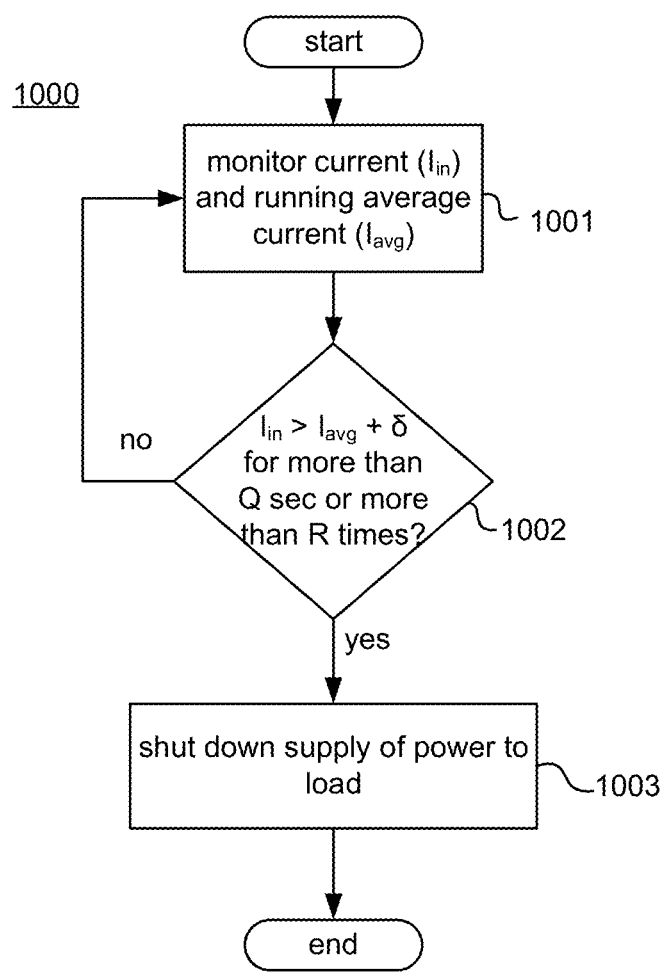

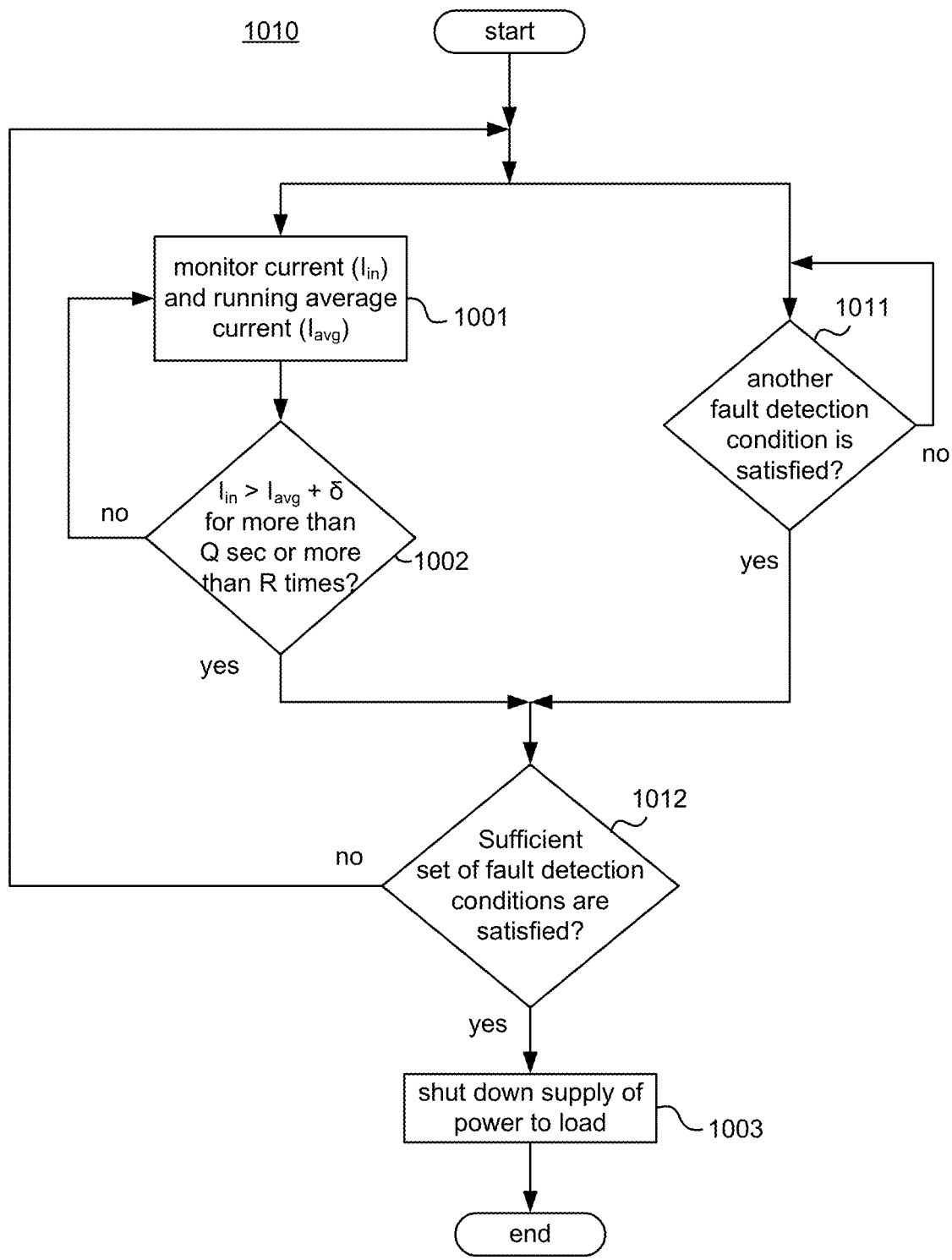

FAULT DETECTION BASED ON COMPARING INPUT CURRENT AND MOVING AVERAGE INPUT CURRENT

BACKGROUND

A power supply is a device that can provide power to an electronic device, such as a server. For example, a power supply may convert power from a form that is not suitable for the electronic device (such as an alternating current (AC) power signal) into a form that is suitable for the electronic device (such as direct current (DC) power signal having a specific voltage).

Some power supplies include power factor correction (PFC) circuits that correct the power factor of the power drawn by the power supply. In particular, active PFC circuits work to ensure that the waveforms of the current drawn by the power supply and the voltage of the input AC power signal are congruent and in-phase—that is, that the phase difference between the current and voltage waveforms is as close to zero as possible and both waveforms have similar shapes (i.e., both are sinusoidal). For example, a PFC circuit may correct the power factor by using active circuitry to change the waveform of the current that is drawn to make it sinusoidal and reduce the phase difference.

BRIEF DESCRIPTION OF THE DRAWINGS

FIG. 3 is a process flow diagram illustrating a first example process of fault detection based on satisfaction of an average current fault detection condition.

FIG. 4 is a process flow diagram illustrating a second example process of fault detection based on satisfaction of an average current fault detection condition in which additional fault detection conditions are considered.

DETAILED DESCRIPTION

Figure 1:
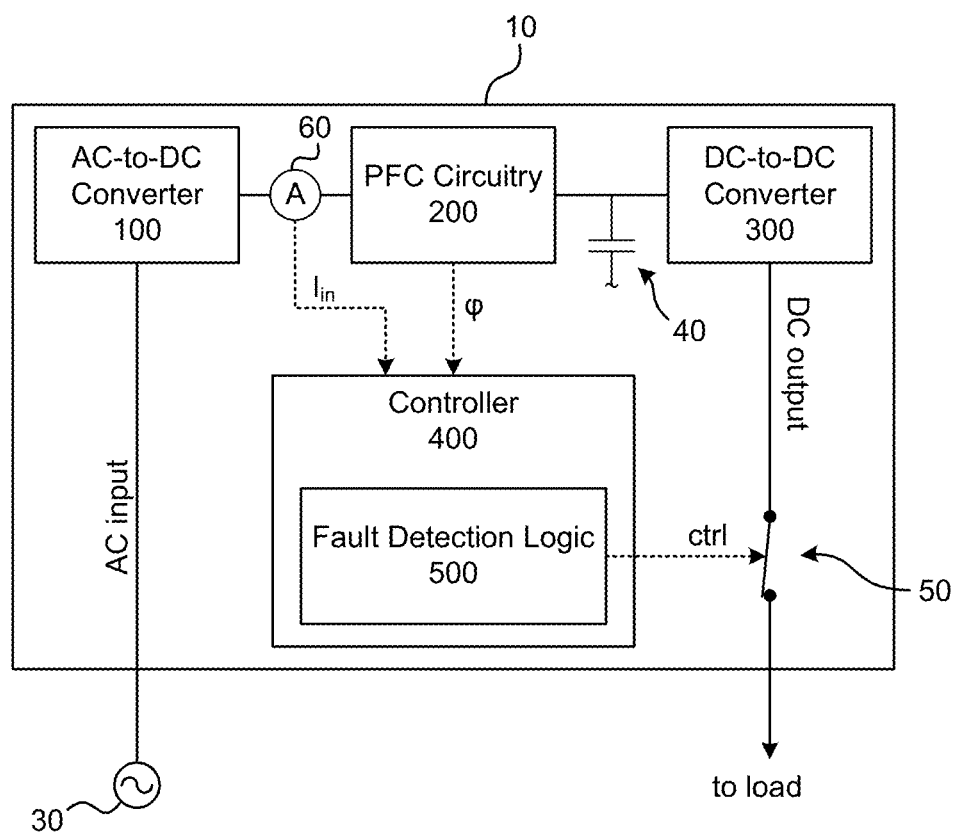
FIG. 1 is a block diagram illustrating an example power supply.

Electrical systems, such as servers, may be susceptible to electrical faults that can degrade performance and damage the system. For example, a short may occur in a system as a result of failure of a component that was not manufactured up to specification or has some other flaw. Such a short could result in the system drawing too much current (referred to as an overcurrent condition), which may result in excessive heat generation that may cause components to fail and otherwise damage the system. In some cases, one fault may lead to other faults in a cascading fashion, multiplying the damage to the system. In extreme cases, fire or other severe thermal events may occur, resulting in the total destruction of the electrical system and possibly neighboring devices.

Accordingly, power supplies and electrical devices may include various countermeasures to prevent such faults and/or to mitigate damage when such faults occur. For example, fuses and circuit breakers may be used to prevent too much current from flowing through certain lines.

However, existing countermeasures for overcurrent conditions may have some deficiencies. For example, it may not be possible, or may be too costly, to prevent all overcurrent conditions using fuses, as different parts of the system may have different current ratings and thus may require different fuses to be distributed throughout the system. For example, a fuse at the input of the power supply would need to allow sufficient current to pass through for the entire system, but this level of current may be more than enough to fry individual down-stream components, and a fault occurring at the down-stream components may never trip the fuse at the input.

Thus, disclosed herein are example power supplies that may counteract overcurrent conditions while overcoming some of the difficulties noted above. In particular, in example power supplies described herein, faults are detected by monitoring for rapid changes in the amount of current being drawn by the power supply from the input power source ("input current" or "$I_{in}$"). That is, rather than merely considering the absolute amount of input current being drawn, in examples disclosed herein the rate of change of the input current is considered. More specifically, the controller of the power supply will keep track of a moving average of the input current ("$I_{avg}$"), periodically compare the moving average $I_{avg}$ to the present value of the input current $I_{in}$, and if $I_{in}$ exceeds $I_{avg}$ by more than a threshold amount, then this is counted as a current spike that may potentially signal a fault. If more than a specified number of such spikes are detected within a time period, then this triggers a fault detection condition. The determination of whether $I_{in}$ exceeds $I_{avg}$ by the threshold amount more than a specified number of times in a specified period may be referred to herein as the average current fault detection condition.

The average current fault detection condition may enable the power supplies to detect spikes in current that may be indicative of a fault condition. A spike is a rapid increase in the amount of input current, and can be caused by a fault condition such as a short. For example, when a short is starting to develop, there are often multiple brief spikes of current that occur just before the short fully develops. As another example, when the short finally does fully develop, there will be another spike in current. Thus, when such spikes are detected via the average current fault detection condition, the power supplies may infer that a fault condition is developing or has occurred, and may take protective measures to combat the possible fault indicated by the spikes, such as opening a switch to cut off the flow of current through the power supply.

In some examples, the average current fault detection condition being satisfied may be sufficient on its own to trigger the preventive countermeasures (e.g., shutting down power). However, in some examples additional fault detection conditions may also be considered before triggering the preventive countermeasures. For example, a PFC fault detection condition may be used in conjunction with the average current fault detection condition, where the PFC fault detection condition is satisfied when the amount of correction being applied by a PFC circuit is near zero for a period of time. Requiring that multiple fault detection conditions be satisfied before shutting down the power supply may help to reduce the numbers of false positives that may otherwise occur. The PFC fault detection condition is described in greater detail below, as well as in U.S. patent application Ser. No. 16/174,847, filed 30 Oct. 2018, the contents of which are incorporated herein by reference in their entirety.

An advantage of the examples disclosed herein is that they may be able to handle fault conditions that a fuse or other conventional countermeasures would not handle well. For example, power supplies disclosed herein may be able to detect fault conditions even when the absolute amount of current being drawn is lower than a maximum current rating of the power supply. Specifically, because a rate of change of the current is considered rather than the absolute amount of current, current spikes indicative of faults may be detected even when the absolute magnitude of the spike is relatively low. This may allow the system to be shut down before too much damage is caused by the fault. In contrast, protective measures that rely on the absolute amount of current being drawn (such as a fuse) trigger only when the current surpasses a maximum current threshold, and thus such measures might never trigger for some faults or may trigger only after substantial damage has already be done to the system.

As an example of a fault that could be detected by the example power supplies disclosed herein but that might not be detected by other countermeasures, consider the following hypothetical. Suppose that a power supply can provide up to a maximum of 100 A at 12 V, but that currently the load is drawing only 20% of the rated capacity (i.e., it is drawing 20 A of current). Suppose further that a short does develop, ultimately resulting in 70 A of current flowing through the short. This means that, when the short occurs, the total current spikes from 20 A to 90 A. However, because the total current is still less than the max rating of 100 A, a fuse on the input line would not be tripped by this short. That means that, if a fuse or similar countermeasure is used, the 70 A of current may continue to flow through the short unabated, which is more than enough current to cause serious damage to the load and/or the power supply. In contrast, the example power supplies described herein could detect such a short, even though the total current draw is less than the max current rating, because they could detect the rapid increase (spike) in current from 20 A to 90 A that occurs when the short develops, and may shut down the flow of current before there is time for much damage to occur. The example power supplies may even be able to detect transient current spikes that occur while the short is developing and shut down the power supply before the short is even able to fully develop.

As can be seen from this example, the higher the max rating of the power supply, the more current is available to feed a short without tripping the fuse. Similarly, the lower the amount of power drawn by the load at any given time, the more current is available to feed a short without tripping a fuse. Thus, the worst-case scenario may occur when a highly-rated power supply is being lightly used, in which case there may be more than enough "headroom" to feed highly damaging amounts of current to a short without tripping the fuse. With some power supplies reaching capacities of up to 4000 W or higher in high-performance computing systems these days, such scenarios are becoming more and more likely. Thus, it is advantageous to be able to detect and mitigate such faults even when the aggregate current flowing through the supply is less than its max rating.

Another advantage of the examples disclosed herein is that they may allow expensive countermeasures, such as e-fuses, to be omitted, thus saving on both the cost of the power supply and the space within the power supply occupied by those devices.

Detailed examples of the aforementioned techniques and devices will now be described with reference to the Figures.

1. Example Power Supply

Example power supplies described herein are configured to convert an input power signal into an output DC power signal that is suitable for a load (such as a server or other computing device). The input power signal may be an AC power signal, or a DC power signal. If the input signal is a DC power signal, the power supply may perform DC-to-DC conversion, among other things, to generate the output DC power signal having a suitable voltage for the load. If the input signal is an AC power signal, the power supply may perform AC-to-DC conversion, among other things, to generate the output DC power signal. In addition, the example power supplies described herein include PFC circuitry to apply power factor correction, and a controller that is configured to perform the operations described herein pertaining to detecting fault conditions by monitoring the amount of correction being applied by the PFC circuitry.

In the example illustrated in FIG. 1, the input power signal is an AC power signal, and the example power supplies will described below primarily in that context. However, it should be understood that other examples may include power supplies in which the input power signal is a DC power signal.

It should be understood that there are numerous ways that a power supply may be configured to convert input power to DC output power, including configurations having different types and/or numbers of converters, as well as different supporting components such as filters, correction circuitry, transformers, etc. FIG. 1 illustrates one specific example of a power supply, but it should be understood that the techniques described herein for fault detection based on comparing input current to a moving average current could be implemented using any other configuration of a power supply.

FIG. 1 illustrates the example power supply 10. The example power supply 10 includes an AC-to-DC converter 100, PFC circuitry 200 (also referred to as "the PFC"), a DC-to-DC converter 300, and a controller 400. The power supply 10 may also include a bulk capacitor 40, a cut-off switch 50, and a current sensor 60. In FIG. 1, power signals are illustrated using solid lines, while communications and/or control signals are illustrated using dashed lines. In FIG. 1, only half of the wiring path for the power signals is illustrated to simplify the diagram, but it should be understood that there would also be return paths (not illustrated) to complete the circuit.

The AC-to-DC converter 100 is configured to receive an input AC power signal from an AC power source 30, such as a power distribution unit and/or mains power supply line. The AC-to-DC converter 100 is configured to convert the input AC power signal into a DC power signal. There are numerous types of AC-to-DC converters, and any type could be used as the AC-to-DC converter 100. For example, the AC-to-DC converter 100 may include a bridge rectifier. The AC-to-DC converter 100 may also include additional components, such as a filter for filtering the input AC power signal, a capacitor to receive the converted power signal, etc.

The PFC 200 is configured to apply power factor correction to the power drawn by the power supply 10. In the illustrated example, the PFC 200 receives the signal that is output by the AC-to-DC converter 100, applies power factor correction, and outputs a corrected DC power signal to the DC-to-DC converter 300 (for example, via a bulk storage capacitor 40). The PFC 200 corrects the power factor by altering the waveform of the current that is drawn from the AC power source 30 ($I_{in}$) such that the current waveform is sinusoidal and the phase difference between $I_{in}$ and the voltage of the AC input signal ($V_{in}$) is zero (or as close as possible). For example, the PFC 200 may include a boost converter, and may alter the waveform of the current $I_{in}$ by such modulating a duty cycle of a signal that controls a switch of the boost converter.

The correction applied by the PFC circuitry 200 may be controlled by a PFC controller. For example, if the PFC circuitry 200 uses a boost converter to modify the current waveform, then the signal that controls the switch of the boost converter may be generated by the PFC controller.

In some examples, the PFC controller may be distinct from the main controller of the power supply 10. For example, the PFC controller may be integrated into the PFC circuitry 200. For example, the PFC controller may be provided as a discrete integrated circuit (IC); for example, commercially available PFC controller ICs may be used as the PFC controller.

In other examples, the PFC controller may be part of the main controller of the power supply (e.g., the controller 400). For example, the controller 400 may include PFC control logic (not illustrated) that acts as the PFC controller and executes operations to control the PFC 200, with the logic comprising any combination of processor(s) executing instructions and dedicated hardware such as ASIC(s).

The DC-to-DC converter 300 may convert the signal output by the PFC circuitry 200 to a desired voltage for the electronic device, and supply the converted DC output signal to the electronic device. There are numerous types of DC-to-DC converters, and any type could be used as the DC-to-DC converter 300. For example, the DC-to-DC converter 300 may include a switch-mode DC-DC converter.

The current sensor 60 is to measure an amount of input current $I_{in}$ currently being drawn by the power supply 10 from the input power source 30, and provide that information to the controller 400. The current sensor 60 may sense the input current $I_{in}$ periodically, such as every clock cycle. In FIG. 1, the current sensor 60 is illustrated as being located between the AC-to-DC converter 100 and the PFC 200, but the current sensor 60 could be located anywhere in the power supply 10 that allows it to measure the current flowing through the power supply 10. Moreover, although the current sensor 60 is illustrated in FIG. 1 as being separate from the other components, the current sensor 60 could be an integral part of another component of the power supply 10, such as a part of the converter 100, the PFC circuitry 200, etc.

The controller 400 may be configured to perform the operations described herein, such as the operations of processes 1000-1020 that are described in section 2 below with reference to FIGS. 3-5. In some examples, the controller 400 may be a main controller of the power supply 10, and may control other operations of the power supply 10 besides the operations described herein. In other examples, the controller 400 may be separate from the main controller of the power supply 10; for example, the controller 400 may be a special purpose controller. In either case, the controller 400 may include fault detection logic 500. The fault detection logic 500 may include a processor that is to execute stored instructions to perform the operations described herein, dedicated hardware that is configured to perform the operations described herein, or any combination of these. The fault detection logic 500 is described in greater detail below in section 1.1.

In FIG. 1, the PFC 200 is shown as being between the AC-to-DC converter 100 and the DC-DC converter 300, but this is just one possible configuration. In other examples, the PFC 200 may be located elsewhere in the power supply 10.

In FIG. 1, various components, such as filters, capacitors, transformers, correction circuitry, etc. are omitted to simplify the diagram. However, in practice any number of such components may be included in the power supply 10 in any configuration.

Although FIG. 1 may give the appearance that the controller 400 is collocated with the other components, this need not necessarily by the case. In some examples, the controller 400 may be contained within a same chassis or device housing as the other components of the power supply 10. For example, when the controller 400 is implemented as the main controller of the power supply 10, it may generally (although not of necessity) be located within the main chassis or device housing as the rest of power supply 10. However, in other examples the controller 400 may be located outside of the chassis or housing of the power supply 10, and may communicate with the rest of the power supply 10 via a communications interface. For example, in some cases in which the controller 400 is not part of the main controller of the power supply 10, the controller 400 may be housed within a different device housing, such as in a multi-node system management unit (e.g., rack management unit).

1.1 Fault Detection Logic 500

The fault detection logic 500 may be configured to monitor (i.e., periodically measure) the input current $I_{in}$, keep track of the moving average $I_{avg}$ of the input current $I_{in}$, and periodically compare the moving average $I_{avg}$ to the present value of the input current $I_{in}$. If $I_{in}$ exceeds $I_{avg}$ by more than a threshold amount ("δ"), then the fault detection logic 500 notes this as a current spike that may be indicative of a fault. If a specified number or more of such current spikes are detected within a given time period, then the fault detection logic 500 determines that the average current fault detection condition is satisfied. The satisfaction of the average current fault detection condition may be a trigger, by itself or in conjunction with the satisfaction of other fault detection conditions, for the fault detection logic 500 to enact countermeasures (such as shutting down the power supply).

As noted above, the fault detection logic 500 may consider additional fault detection conditions in addition to the average current fault detection condition in determining whether or not a fault is present. For example, the fault detection logic 500 may also test a PFC fault detection condition (described in greater detail below), or any other condition that may be indicative of a fault. For example, FIG. 2A illustrates an example in which the fault detection logic 500 includes logic for testing multiple fault detection conditions.

Figure 2A:
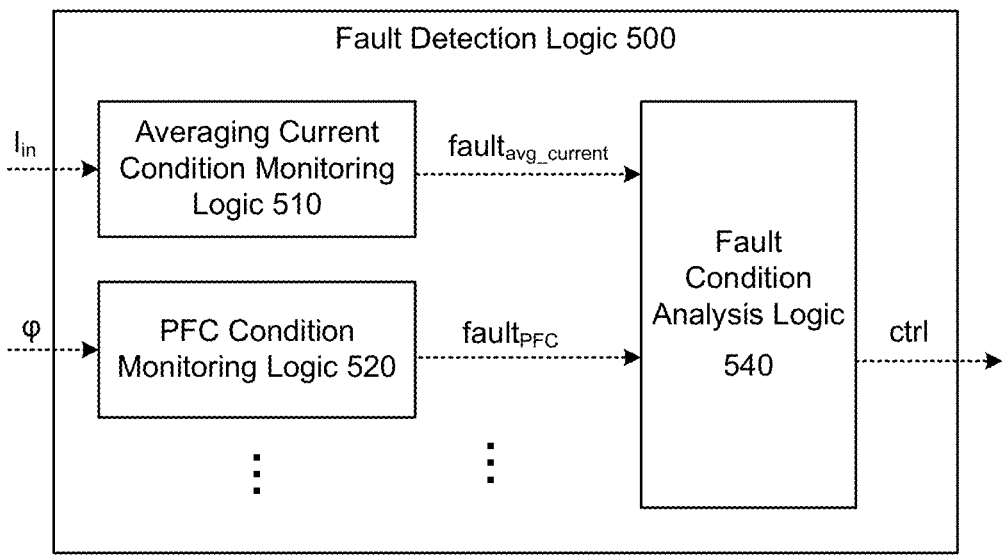
FIG. 2A is a block diagram illustrating example fault detection logic.

In the example of FIG. 2A, the fault detection logic 500 monitors two fault detection conditions to determine whether a fault has occurred. In particular, the fault detection logic 500 in FIG. 2A includes include average current condition monitoring logic 510 to determine whether the average current fault detection condition is fulfilled, and PFC condition monitoring logic 520 to determine whether the PFC fault detection condition is fulfilled. In some examples, the fault detection logic 500 may also include additional logic to test other conditions, which is represented in FIG. 2A by the ellipses. The fault detection logic 500 may also include fault condition analysis logic 540 that considers each of the monitored fault detection conditions and determines whether a fault is detected based on which if any of the monitored fault detection conditions are fulfilled.

Generally, the fault condition analyses logic 540 may be configured to implement any desired logical rule for detecting a fault based on the monitored conditions. That is, each conditions may be a necessary condition, a sufficient condition, a necessary and sufficient condition, a member of a necessary set of conditions, a member of a sufficient set of conditions, or a member of a necessary and sufficient set of conditions. For example, in some examples the fault condition analyses logic 540 may detect a fault when any one of the monitored conditions is fulfilled (i.e., each condition is a sufficient condition for detecting a fault). In other examples, the fault condition analysis logic 540 may detect a fault only when all of the monitored conditions are fulfilled at the same time (or within a specified time period) (i.e., each condition is a necessary condition for detecting a fault). In other examples, the fault condition analysis logic 540 may detect a fault when a specific number of conditions are satisfied or when a specific collection of conditions are satisfied (i.e., each condition is a member of a sufficient set of conditions).

In one particular example implementation, the fault detection logic 500 monitors the average current fault detection condition and the PFC fault detection condition, and detects a fault only when both of these conditions are satisfied at the same time (or within a specified time of one another). By requiring both fault detection conditions to be triggered before a fault is identified, false positives may be reduced.

As noted above, the fault detection logic 500 may cut off the power flowing through the power supply 10 responsive to one or more of the fault detection conditions being satisfied. This may be done, for example, by generating a control signal ctrl that opens a switch 50, thus breaking the power circuit and ceasing the flow of power through the power supply 10.

Although FIG. 1 illustrates one switch 50 that is located between the DC-to-DC converter 300 and the electronic device, this is merely an example and one or more switches 50 could be located anywhere in the flow path of the power signal to break the circuit. Furthermore, a switch 50 is just one possible way to shut down the supply of power, and any other method of shutting down the supply of power could be used. For example, one or both of the converters 100, 300 may be capable of shutting down the supply of power responsive to a command from the fault detection logic 500.

1.1.1 Average Current Condition Monitoring Logic 510

Figure 2B:
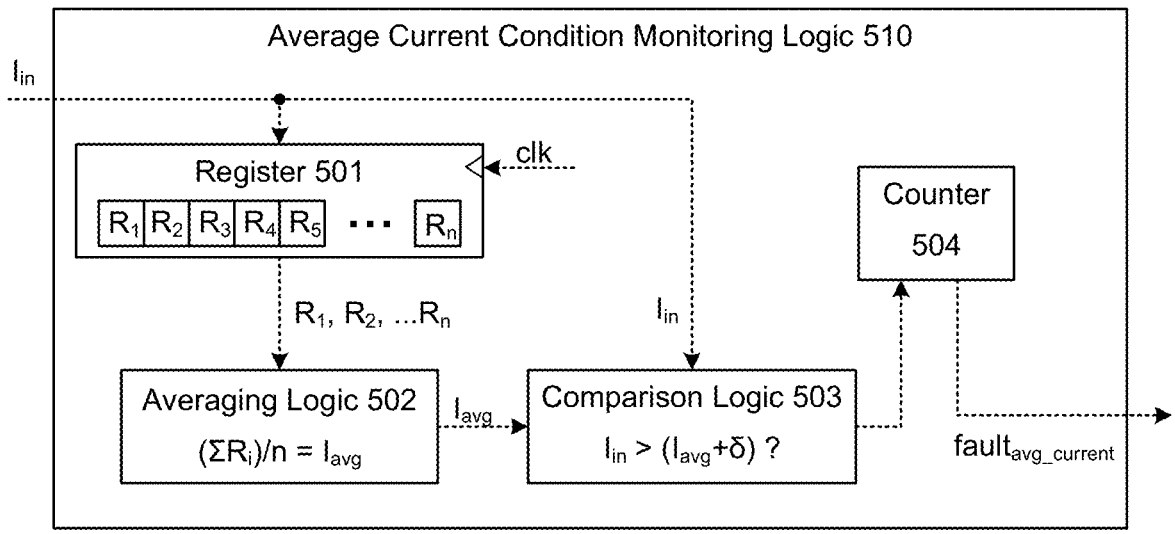
FIG. 2B is a block diagram illustrating example average current condition monitoring logic.

FIG. 2B illustrates a more detailed example of the average current condition monitoring logic 510. The example average current condition monitoring logic 510 includes a register 501, averaging logic 502, comparison logic 503, and a counter 504. The average current condition monitoring logic 510 monitors the input current by periodically receiving the digital value $I_{in}$, which represents the measured input current, from the current sensor 60 (or from an intermediary). The received value of $I_{in}$ is stored in the register 501 each time it is received. When the register 501 becomes full, the most recent value of $I_{in}$ replaces the oldest value stored in the register 501. Periodically, the values stored in the register 501 are averaged. That is, the values stored in the storage units $R_1$ through $R_n$ of the register 501 are output to averaging logic 502, which computes the arithmetic mean $$\left(\frac{\Sigma_i R_i}{n}\right)$$

and outputs the result as the moving average $I_{avg}$ of the input current. The moving average $I_{avg}$ is then input into the comparison logic 503 along with the most recent measurement of the input current $I_{in}$, and the comparison logic determines whether $I_{in} > I_{avg} + \delta$. If $I_{in} > I_{avg} + \delta$, then the comparison logic 503 generates a signal that indicates that a spike has been detected. The counter 504 may count the number of spikes detected by the comparison logic 503, and may generate a signal $fault_{avg\_current}$ to indicate that the average current fault detection condition has been satisfied if the number of detected spikes equals or exceeds a specified number within a specified time period.

The average current fault detection condition is designed to detect faults, such as short circuits, based on the recognition that there are generally current spikes, characterized by large and rapid (steep) increase in current, during development of a short. By comparing the present current to the moving average current, such spikes may be detected, since large rapid increases in current will cause $I_{in}$ to exceed $I_{avg}$ by more than $\delta$. In particular, although $I_{avg}$ does ultimately follow $I_{in}$, because $I_{avg}$ is a moving average over multiple sample periods, $I_{avg}$ will lag behind $I_{in}$ by multiple sample periods. Thus, if the magnitude of $I_{in}$ increases greatly over the course of one or a few sample periods, $I_{in}$ will be greater than $I_{avg} + \delta$ because the magnitude of $I_{avg}$ will not have had time to change yet. On the other hand, if the magnitude of $I_{in}$ increases by a small amount (e.g., less than $\delta$), then $I_{in}$ will not exceed $I_{avg} + \delta$. Furthermore, even if the magnitude of $I_{in}$ increases by a large amount (e.g., more than $\delta$), if it does so gradually (i.e., over the course of many sample periods), then $I_{in}$ will still probably not exceed $I_{avg}$ by $\delta$, since the gradual increase in current allows $I_{avg}$ to have sufficient time to begin rising along with $I_{in}$ so that the difference between $I_{in}$ and $I_{avg}$ never gets too large.

Importantly, the average current fault detection condition detects changes in the magnitude of the current, rather than the absolute magnitude of the current. Thus, even if $I_{in}$ stays well below the max rating, the average current fault detection condition may still be triggered if $I_{in}$ rises too much or too quickly. In other words, the average current fault detection condition can detect current spikes indicative of a fault even when the total current flowing through the supply is low. This is an advantage over protective measures that rely on the absolute amount of current being drawn (such as a fuse), since as noted above damaging faults can occur even when the total current being drawn is not overly large.

The register 501 may be any storage device that is configured to store the periodically received values $I_{in}$ in a number (n) of storage units $R_1$ through $R_n$, with newly stored values replacing the oldest values stored in the register 501. For example, the register 501 could be shift register, such as a serial-in-parallel-out shift register (or a combination of multiple serial-in-parallel-out shift registers), a parallel-in-parallel-out shift register, a universal shift register, etc. As another example, the register 501 could be a circular buffer (aka ring buffer). As another example, the register 501 could be implemented in a region of memory (e.g., main system memory) or other storage (e.g., flash storage) together with instructions executed by a processor to control storage of the values $I_{in}$ in the manner described above.

Because the register 501 stores up to n values of $I_{in}$ and replaces the oldest stored value of $I_{in}$ when a new one is written, the contents of the register at any given time represent a snapshot of the n most recently measured values of the input current $I_{in}$. Thus, if the contents of the register 501 are averaged, the result corresponds to a moving average of the current measurements $I_{in}$, with a time window of the moving average starting at the time t−n·p and ending at the time t, where t is the current time (+/−p) and p is the time between subsequent measurements of $I_{in}$. In other words, when the contents of the register 501 are averaged, the result is a moving average with a time window of [t−n·p, t]. In some examples, $I_{in}$ is measured every clock cycle of the base clock clk for the power supply 10, although other measurement periods could be used.

Each storage unit $R_i$ may include k bit storage cells, with k being any integer value that strikes a desired balance between the competing interests of (a) increasing the accuracy/resolution of the calculated average current value (higher k means higher accuracy/resolution) and (b) decreasing the cost and/or increasing the speed of the logic 510 (higher k means more costly and/or slower logic 510). In some examples, k may be equal to the number of bits in the digital value $I_{in}$ that represents the measured input current. In some examples, k may be lower than the number of bits in the digital value $I_{in}$, in which case the values $I_{in}$ may be truncated when stored in the register 501. In one implementation example, k=16 and the number of bits in $I_{in}$ is also 16.

The number n of storage units $R_i$ that are included in the register 501 may be determined based on the desired size of a time window for the moving average. As noted above, the time window for the moving average is [t−n·p, t], which has a width of n·p. Thus, if the desired time window is A sec, then the number of units $R_i$ should be set to n=A/p (recall that p is the sampling period for $I_{in}$). For example, if the desired time window of 1 ms and the input current $I_{in}$ is sampled every 10 μs, then the register 501 would need to have n=100 of the units $R_i$, which would mean that the register 501 would need to have 1600 storage cells if each unit $R_i$ has 16 storage cells.

The averaging logic 502 can be implemented using a dedicated averaging circuit, such as a digital averaging circuit. The averaging logic 502 can also be implemented using a processor executing instructions. The period at which the averaging logic 502 calculates the average $I_{avg}$ of the contents of the register 501 may be the same as, or different from, the period p at which the input current $I_{in}$ is measured. In some examples, the averaging logic 502 performs the averaging every clock cycle.

The comparison logic 503 can be implemented using a dedicated comparison circuit, such as a digital comparator. The comparison logic 503 can also be implemented using a processor executing instructions. The period at which the comparison logic 503 compares $I_{avg}$ and $I_{in}$ may be the same as, or different from, the period p at which the input current $I_{in}$ is measured and/or the period at which $I_{avg}$ is calculated. In some examples, the averaging logic 502 performs the averaging every clock cycle. If the value $I_{in}$ exceeds $I_{avg}+\delta$, then the comparison logic 504 may generate a signal indicating a current spike has been detected.

The parameter δ may help to avoid false positive triggering of the average current fault detection condition. In particular, the input current is expected to increase occasionally under normal (i.e., non-fault) conditions, such as when the load experiences heavier usage. However, normal increases in the input current are generally gradual and/or small with a single step up, while increase in the current that are the result of a fault are generally sharp (steep, rapid), large, and/or repeatedly spiking. Thus, by setting the parameter δ to be just higher than the expected rate of change for the current under normal conditions, most increases in current that are attributable to normal conditions will not trigger the fault detection condition, while steep spikes in current (which may be attributable to a fault) will still trigger the fault detection condition. The parameter δ may be programmable, preset, or automated.

In some examples, the parameter δ may be variably set based on the current or historical values of $I_{in}$ and/or $I_{avg}$. For example, δ may be equal $I_{avg}$·m, where m is a multiplier. As another example, the controller 400 may track the difference between $I_{in}$ and $I_{avg}$ during a training period, during which the load and power supply operate normally, and then may set b to equal the highest value of $I_{in}-I_{avg}$ that occurred during the training period (or some multiple thereof). The value δ may also be updated periodically or continuously.

The counter 504 may be implemented using a dedicated circuit, such as a counter combined with a digital comparator. The counter 504 can also be implemented using a processor executing instructions. The counter 504 may keep track of how many spikes have been detected by the comparison logic 503 over a specified time period, spike_count, and compare that value to a specified value q. If spike_count≥q then the counter 504 indicates that the average current fault detection condition has been satisfied, for example by outputting a signal $fault_{avg\_current}$. The parameter q may help to avoid false positives. In particular, because shorts often involve multiple current spikes (often while the short is still developing), while increases in current due to normal conditions generally involve an isolated step up, setting the value of q to be greater than 1 may help to decrease the number of false positives while still catching most fault events. In some examples, q is set to 2, 3, 4, or 5.

In the description above, delays that may occur between the different operations performed by the logic 510 are ignored, such that the values $I_{avg}$ and $I_{in}$ that are compared are in the logic 503 are treated as if they both reflect the most recent measurements of the input current. However, in some examples, processing delays may occur between operations such that it is possible for the value $I_{avg}$ and the value $I_{in}$ to be slightly out-of-sync. For example, suppose that a new input value $I_{in\_x}$ is stored in the register 510 at the start of the $x^{th}$ sampling period (e.g., on the rising edge of clk). In some examples, if the averaging logic 502 reads the values stored in the register 501 at the start of the $x^{th}$ sampling period, the value $I_{in\_x}$ might not be included in the read values, as it has yet to be loaded into the register. Thus, in such an example, the average $I_{avg}$ that is calculated in the $x^{th}$ sampling period is an average of the contents of the register 501 from the previous sampling period, and does not reflect the most recent value $I_{in\_x}$. Similarly, in some examples, if the comparison logic reads the value $I_{avg}$ at the start of the $x^{th}$ sampling period, the value $I_{avg}$ that is read may be the average that was computed during the previous sampling period. Thus, in such examples, the value $I_{avg}$ that is compared to $I_{in\_x}$ in the logic 503 may actually be a moving average of the values $I_{in\_x-n-2}$ through $I_{in\_x-2}$. In other words, for the moving average $I_{avg}$ that is compared to $I_{in\_x}$, the time window may actually be [x−n−2, x−2] rather than [x−n, x]. In some examples, such time delays between the value $I_{in}$ and the value $I_{avg}$ that are compared in the logic 503 may be acceptable or even desirable.

However, in some examples, such time differences may be compensated for to ensure that the most recent value of $I_{in}$ is being compared to a most up-to-date value of $I_{avg}$. For example, the averaging logic 502 may read the contents of the register just after the new value $I_{in}$ has been loaded (e.g., by slightly shifting the clock that drives the averaging logic 502 relative to the clock that drives the register 501), or the new value $I_{in}$ may be passed through directly to the averaging logic 502 without waiting to be stored, ensuring that the value $I_{avg}$ that is calculated for a given sampling period includes the most recent value $I_{in}$ (if this is desired). Similarly, the comparison logic may read $I_{avg}$ just after the averaging logic 502 has output an updated value of $I_{avg}$, ensuring that the most up-to-date value of $I_{avg}$ is used in the comparison. As another example, the value $I_{in}$ that is input to the comparison logic 503 may be delayed by one or more sampling periods (e.g., in a buffer).

1.1.2 PFC Condition Monitoring Logic 520

The PFC condition monitoring logic 520 is to monitor the amount of correction applied by the PFC 200 ($\varphi$), and, when $\varphi$ is within a threshold P of zero for a threshold T amount of time (the "PFC fault detection condition"), the PFC condition monitoring logic 520 may indicate that the PFC fault detection condition has been satisfied (for example, by outputting the signal $fault_{PFC}$).

In some examples, the amount of correction that is applied ($\varphi$) may correspond to a phase shift that has actually been applied by the PFC circuitry—i.e., the number of degrees the phase of the current waveform has been shifted as a result of the power factor correction from what it otherwise would have been without the power factor correction.

In some examples, $\varphi$ may correspond to the phase difference between the uncorrected current waveform and the voltage waveforms—i.e., the phase difference that would have been present if the power factor correction had not been applied. Although such a phase difference may not be precisely equal to the amount of correction that was actually applied by the PFC 200 (since no PFC circuit is perfect), such a phase difference may be treated as an estimate of the amount of correction that was performed, and thus may be used as cp.

In some examples, $\varphi$ may be obtained by the controller 400 from the PFC controller. For example, the PFC controller may explicitly determine and output a value to the PFC condition monitoring logic 520 that is indicative of an amount of correction being applied. The value output by the PFC controller may be equal to $\varphi$, or may be a value from which the fault detection logic 500 can derive $\varphi$. For example, in cases in which the PFC circuitry 200 includes a boost converter, the PFC condition monitoring logic 520 may be able to derive $\varphi$ from information about the duty cycle pattern of the control signal of the switch in the boost converter.

In other examples, $\varphi$ may be derived by the controller 400 by analyzing the signals in the circuit. For example, the controller 400 may monitor the supply input power $P_{in}$ and output power $P_{out}$ and estimate an output efficiency by calculating $P_{in}/P_{out}-E$, where E is an efficiency factor E. The output efficiency calculated in this way corresponds to the phase angle shift $\varphi$.

2. Example Average Current Fault Detection Operations

Figure 5:
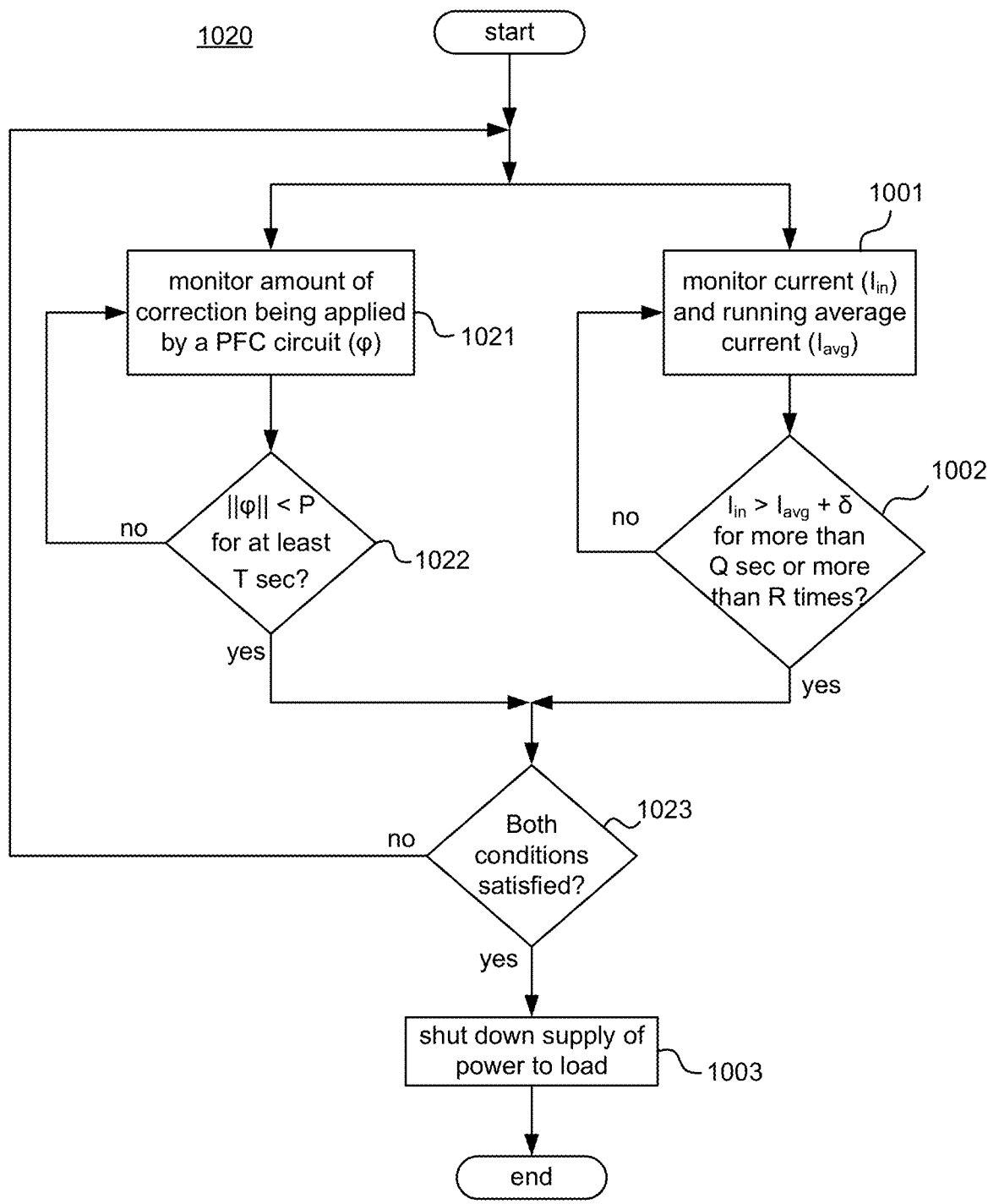
FIG. 5 is a process flow diagram illustrating a third example process of fault detection based on satisfaction of an average current fault detection condition in which a PFC fault detection condition is considered.

FIGS. 3-5 illustrate example processes 1000, 1010, and 1020 of detecting and responding to electrical faults based on monitoring the input current of a power supply. The example processes 1000-1020 are related—specifically, the process 1010 is one particular example implementation of the process 1000 in which additional conditions besides the average current fault detection condition are considered, and the process 1020 is one particular example implementation of the process 1010 in which the additional condition is specifically the PFC fault detection condition. Thus, some operations are the same in across the processes 1000-1020, and such operations will be described in detail only once to avoid duplicative description.

The example processes 1000, 1010, and 1020 may be performed by a controller of a power supply (e.g., the controller 400 of the power supply 10) containing logic that is configured to perform the operations (e.g., the fault detection logic 500). For example, one or more processors included in the controller may perform some or all of the processes 1000, 1010, and 1020 as a result of executing machine readable instructions corresponding to the operations described below (such as the fault detection instructions 503). As another example, one or more dedicated hardware devices (such as ASICs, FPGAs, CPLDs, etc.) included in the controller may perform some or all of the processes 1000, 1010, and 1020. The controller may be, but does not necessarily have to be, a main controller of the power supply.

2.1 Example Process 1000 for Average Current Fault Detection

FIG. 3 illustrates the example process 1000.

In block 1001, the current that the power supply draws from the AC source ($I_{in}$) is monitored, and a running average of the current ($I_{avg}$) is tracked. For example, $I_{in}$ values may be sampled periodically—for example every clock cycle—and the samples may be stored in a register, as described above in relation to FIG. 2. The values stored in the register may be fed to averaging logic periodically (e.g., every clock cycle) that determines an average of the values stored in the register.

In block 1002, the controller determines whether the present current $I_{in}$ exceeds the moving average $I_{avg}$ by more than a threshold $\delta$, or in other words whether $I_{in}>I_{avg}+\delta$. If so, then the process continues to block 1003, and if not the process loops back to block 1001 to check the condition again during the next testing period.

In some examples, block 1002 may further require that $I_{in}>I_{avg}+\delta$ be true for either more than a threshold r amount of time or more than a threshold q number of times within a period, before moving on to block 1003.

At block 1003, the controller shuts down the supply of power to the load (e.g., a computing device) responsive to the average current fault detection condition of block 1002 being satisfied.

Although FIG. 3 illustrates just the average current fault detection condition being tested, it should be understood that the decision to shut down the supply of power to the load may also be conditioned on satisfaction of other conditions, as noted above with respect to FIG. 2. Specifically, FIG. 3 is intended to show that the shutting down of the supply of power in block 1003 is based on (conditioned on) the satisfaction the average current fault condition of block 1002, but not necessarily that the supply of power is shut down every time that the condition of block 1002 is satisfied (since other conditions may also need to be satisfied).

The processes 1010 and 1020 illustrated in FIGS. 4 and 5 illustrate two example implementations in which shutting down the supply of power is conditioned upon other conditions in addition to the average current fault detection condition.

2.2 Example Process 1010 with Additional Conditions

FIG. 4 illustrates the process 1010, which is an example of how the process 1000 could be implemented with additional conditions being considered in addition to the PFC fault detection condition. The process 1010 includes blocks 1001-1003 from the process 1000, and adds the blocks 1011 and 1012.

In block 1011, the controller determines whether another fault detection condition, besides the average current fault detection condition, is satisfied. If so, then the process continues to block 1012, and if not then the process loops back to check the condition of block 1011 again. Any condition may be checked in block 1012. For example, the condition of block 1011 may be the PFC fault detection condition described below in reference to FIG. 5, or some other condition.

Although one instance of block 1011 is illustrated, in practice any number of additional conditions could be considered, each with a corresponding instance of block 1011.

In block 1012, the controller determines whether a sufficient set of fault detection conditions are satisfied. If so, then the process continues to block 1003, and if not then the process loops back and checks the conditions again. In some examples, all of the conditions that are tested may need to be satisfied in order to constitute a sufficient set. In other examples, a specific number of conditions, which may be less than all of the conditions tested, may need to be satisfied in order to constitute a sufficient set. In other examples, specific combinations of conditions may need to be satisfied in order to constitute a sufficient set. In other examples, any one of the conditions being satisfied constitutes a sufficient set.

One reason why it may be beneficial to consider additional conditions, besides the average current fault detection condition, is to help reduce the incidence of false positives.

2.3 Example Process 1020 with Average Current Condition

FIG. 5 illustrates the process 1020, which is an example of how the processes 1000 and 1010 could be implemented with PFC fault detection condition being considered in addition to the average current fault detection condition. The process 1020 includes blocks 1001-1003 from the process 1000, and adds the blocks 1021, 1022, and 1023.

In other words, the process 1020 is a specific example of the process 1010 in which the "another fault detection condition" of block 1011 is the PFC fault detection condition. Thus block 1011 from FIG. 4 is replaced in FIG. 5 by blocks 1021 and 1022.

In block 1021, the controller monitors $\varphi$, which is the amount of correction being applied by the PFC circuit of the power supply. The value $\varphi$ may be obtained by the controller by any of the methods described above. For example, $\varphi$ may be obtained directly from the controller of the PFC circuitry, or may be derived from other information obtained from the PFC circuitry. The process then continues to block 1022.

At block 1022, the controller determines whether $\varphi$ is within a threshold P of zero (i.e., whether $\|\varphi\|<P$) for at least a threshold T seconds. The condition that is tested in block 1022 is referred to hereinafter as the PFC fault detection condition. If the PFC fault detection condition is satisfied, then the process continues to block 1023, and if not then the process loops back to block 1021. Thus, blocks 1021 and 1022 form a loop that continually monitors $\varphi$ until the PFC fault detection condition is satisfied. The controller may be configured to go through the loop periodically, such as, for example, every n clock cycles where n is a specified integer.

In block 1023, the controller determines whether both conditions—the PFC fault detection condition of block 1021 and the average current fault detection condition of block 1022—are satisfied. If both conditions are satisfied, then the process continues to block 1003 and the supply of power is shut down. If either condition (or both) are not satisfied, then the process may loop back to test the conditions again during the next testing period. Thus, block 1023 is a specific example of block 1012 in which there are two conditions and both are necessary to constitute a sufficient set.

The threshold P is used in the PFC fault detection condition because it may be the case that $\varphi$ does not actually go exactly to zero when there is a short circuit in the system. In other words, although the short circuit tends to make the load act as if it were mostly purely resistive, there may still be some reactive aspects of the load that prevent $\varphi$ from becoming exactly zero. Thus, P should be set sufficiently high to ensure that actual short circuits are detected. However, setting P too high could result in false positives. Thus, preferably P is set to be higher than a highest value of $\|\varphi\|$ that is expected to occur during a short circuit, and lower than a lowest value of $\|\varphi\|$ that is expected to occur during normal operations of the system. These value may be determined experimentally, or by estimation. For example, in some examples P is set to around 2°.

The time element is included in the PFC fault detection condition to help exclude false positives. In particular, it is possible for $\varphi$ to transiently pass through the neighborhood of zero during normal operations of the system. For example, if the load is predominantly capacitive at one point and then the load changes to being predominantly inductive (e.g., because a bunch of fans have been started up in the server), $\varphi$ will change from a negative value (when the load is capacitive) to a positive value (when the load is inductive) and will pass through zero as part of the change. Such transient passes through the neighborhood of zero ideally should not trigger the PFC fault detection condition. Thus, preferably T is set to be just a little higher than a longest amount of time that is expected for a transient crossing through the neighborhood of zero as part of normal operations. This value may be determined experimentally, or by estimation. For example, in some examples T is set to around 10 ms.

The controller may determine whether the PFC fault detection condition is satisfied at block 1022 by, for example, the following. The controller may check whether $\|\varphi\|<P$ and if so then controller starts a timer if one is not already running. If $\|\varphi\|<P$ is not satisfied, then no timer is started and the timer may be turned off if it was running from a previous test period. Thus, the timer is turned on the first time that $\|\varphi\|<P$ is satisfied and continues to stay on through successive test periods until $\|\varphi\|<P$ is not satisfied. Thus, the present value of the timer indicates how long $\varphi$ has been continuously within P of zero since the last time $\varphi$ entered that range. Thus, if $\|\varphi\|<P$ and if the timer is already running, then the controller may check whether the timer is equal to or greater than T, and if so then the PFC fault detection condition is satisfied. If the timer is less than T, then the timer is kept running until the next testing period.

The process flow diagrams in FIGS. 3-5 and the descriptions herein are presented to aid the understanding of the example processes, but are not intended to be exhaustive descriptions thereof. For example, the example processes could include additional operations besides those illustrated in the Figures and described herein. As another example, the example processes could omit certain operations illustrated in the Figures and described herein. Furthermore, the operations are illustrated in a particular order for ease of description, but in practice some operations may be performed concurrently and/or in a different order than that illustrated.

In addition, certain operations that were described separately for ease of understanding may, in practice, be performed together as part of a single operation.

3. Example Fault Detection Logic 500

Figure 6:
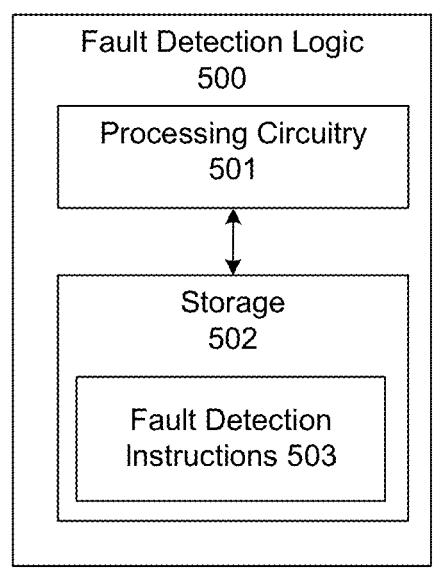
FIG. 6 is a block diagram illustrating an example fault detection logic.

FIG. 6 illustrates an example of the fault detection logic 500 of the controller 400 of the power supply 10. The fault detection logic 500 may be configured to perform some or all the operations described above in relation to the processes 1000-1020. The fault detection logic 500 may include processing circuitry 501 and, in some examples, storage 502 storing fault detection instructions 503.

The processing circuitry 501 may include a number of processors, dedicated hardware, or any combination of these. As used herein, a "processor" may include (or be virtualized from) any circuitry that is capable of executing machine-readable instructions, such as central processing units (CPUs), microprocessors, microcontrollers, digital signal processors (DSPs), application-specific instruction set processors (ASIPs), etc. As used herein, "dedicated hardware" means any physical device or component that is configured to perform a specific operation or set of operations (although not necessarily dependent on executing instructions), such as application-specific integrated circuits (ASICs), complex programmable logic devices (CPLD), field-programmable gate arrays (FPGAs), and so on. There is not necessarily a sharp line between processor and dedicated hardware, and some devices (such as FPGAs) could fall under either category.

Thus, when it is said that the fault detection logic 500 is configured to perform an operation, this means that either there is an instruction stored in the storage 502 that, when executed by a processor of the processing circuitry 501, will cause the processing circuitry 501 to perform the operation, or there is detected hardware in the processing circuitry 501 that is configured to perform the operating.

Accordingly, in some examples the processing circuitry 501 includes a processor and the storage 502 stores machine-readable instructions that, when executed by the processor, cause it to perform operations described herein, such as some or all of the operations of FIG. 3, 4, and/or 5. For example, the storage may include the fault detection instructions 503.

In addition, in some examples the processing circuitry 121 includes dedicated hardware that is configured to perform (or support performance of) operations described herein, such as some or all of the operations of FIG. 3, 4, and/or 5.

In some examples in which the processing circuitry 501 includes both processors and dedicated hardware, some or all of such additional hardware components may be integrated into a same integrated circuit as the processor. In particular, in some such examples, the processing circuitry 501 may be a system-on-chip (SoC).

As noted above, in some examples the fault detection logic 500 includes the storage 502, which may store the machine readable instructions. The storage 502 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

4. Example Machine Readable Media

Figure 7:
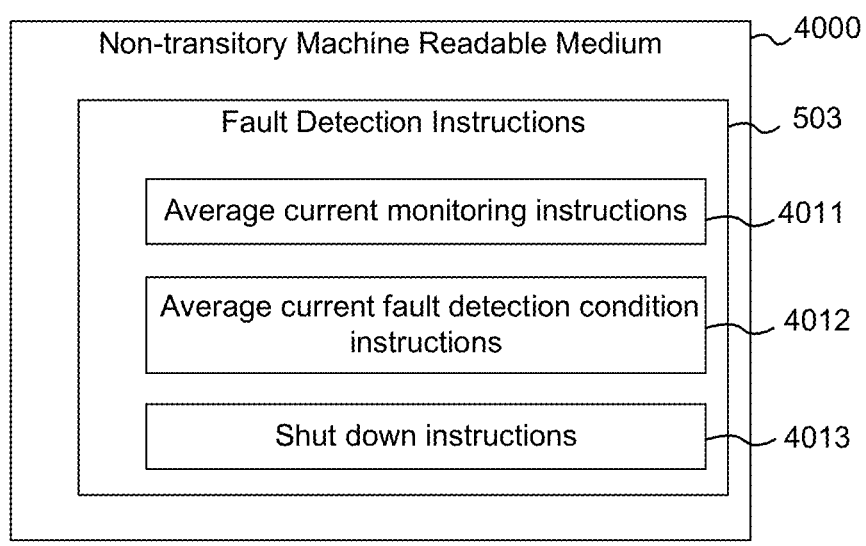
FIG. 7 is a block diagram illustrating an example non-transitory machine readable medium storing example fault detection instructions.

FIG. 7 illustrates an example non-transitory machine readable medium 4000 storing example fault detection instructions 503.

The example non-transitory machine readable medium 4000 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

The example fault detection instructions 503 may include machine readable, processor executable, instructions that are to, when executed by a processor, cause the processor to perform the operations described herein in relation to the process 1000 and FIG. 3. Specifically, example fault detection instructions 503 may include average current monitoring instructions 4011, average current fault detection condition instructions 4012, and shut down instructions 4013.

The average current correction monitoring instructions 4011 may include instructions to monitor the input current $I_{in}$ and to keep track of a moving average $I_{avg}$ thereof (see block 1001).

The average current correction monitoring instructions 4011 may include instructions to determine whether $I_{in} > I_{avg} + \delta$, and in some examples to further determine whether $I_{in} > I_{avg} + \delta$ more than a specified number of times within a period (see block 1002).

The shut down instructions 4013 may include instructions to shut down the supply of power to the load responsive to the average current fault detection condition being satisfied (see block 1003).

The fault detection instructions 503 may also include additional instructions (not illustrated), such as instructions to perform the operations of the process 1010 or the operations of the process 1020 described above.

5. Definitions

Naturally, there is necessarily some finite time delay between when a measurement is taken and when the measurement is reported and/or analyzed, but for purposes of this application a measurement $I_{in}$ is still considered to represent the "current" or "present" input current even if some time has passed since it was taken, as long as the amount of time that has passed is relatively small. In particular, as long as the time from when the measurement $I_{in}$ is taken to the present time is less than or equal to 20 μs, the measurement $I_{in}$ may be considered to represent the "current" or "present" input current. Moreover, some current measurement devices may report a current value that may actually be an average current over a brief measurement time period (e.g., over the past clock cycle) rather than a truly instantaneous measurement, but for purposes of this application such current measurements may be treated as if they are effectively instantaneous current measurements as long as the measurement period is sufficiently short—specifically less than or equal to a few clock cycles of the power supply.

Multiple conditions are considered to be satisfied "together" when they are satisfied at the same time or within a specified time of one another.

As used herein, a "processor" may include any logic circuitry that is capable of executing machine readable instructions stored in a non-transitory machine-readable medium. For example, a "processor" may be, for example, a central processing unit (CPU), a microprocessor, a microcontroller, a digital signal processor (DSP), etc.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of processors, wherein the processors . . . " could encompass both one processor and multiple processors, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form for grammatical consistency, but this does not necessarily mean that only one item is being referred to. Thus, for example, a phrase such as "a processor, wherein the processor . . . " could encompass both one processor and multiple processors, notwithstanding the use of the singular form.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

While the above disclosure has been shown and described with reference to the foregoing examples, it should be understood that other forms, details, and implementations may be made without departing from the spirit and scope of this disclosure.

What is claimed is:

1. A power supply for supplying electrical power to an electronic device, comprising:
   one or more converters that are to convert a received input power signal into a DC power signal that is to supply the electrical power to the electronic device;
   a controller that is configured to:
      periodically measure an input current being drawn from the input power signal;
      periodically determine a moving average of the input current;
      periodically compare the moving average of the input current to the present input current; and
      identify a fault in response to the present input current exceeding the moving average by a threshold amount; and
      shut down supply of power to the electronic device responsive to identifying the fault.

2. The power supply of claim 1,
   wherein the controller is configured to identify the fault when the present input current exceeds the moving average by the threshold amount for longer than a specified amount of time or more than a secured number of times within a specified period.

3. The power supply of claim 1, comprising:
   power factor correction (PFC) circuitry that is configured to correct a power factor of the DC power signal,
   wherein the controller is configured to monitor an amount of correction ($\varphi$) being applied to the DC power signal by the PFC circuitry, and identify the fault when both of the following conditions are satisfied together:
      the present input current exceeds the moving average by the threshold amount; and
      $\varphi$ is within a second threshold of zero degrees for a third threshold amount of time.

4. The power supply of claim 1,
   wherein the controller comprises:
      a register that is to store measured values of the input current,
      averaging logic that is to determine the moving average of the input current by averaging the values stored in the register, and
      comparison logic that is to compare the moving average of the input current to the present input current.

5. A non-transitory machine readable medium storing processor executable instructions for fault detection in a power supply that converts an input power signal into a DC power signal for an electronic device, the instructions being to, when executed by a processor, cause the processor to:
   periodically measure an input current being drawn by the power supply from the input power signal;
   periodically determine a moving average of the input current;
   periodically compare the moving average of the input current to the present input current; and
   identify a fault in response to the present input current exceeding the moving average by a threshold amount; and 3
   shut down supply of power to the electronic device responsive to identifying the fault.

6. The non-transitory machine readable medium of claim 5,
   wherein the controller is configured to identify the fault when the present input current exceeds the moving average by the threshold amount for longer than a specified amount of time or more than a secured number of times within a specified period.

7. The non-transitory machine readable medium of claim 5,
   wherein the power supply includes power factor correction (PFC) circuitry that is configured to correct a power factor of the DC power signal, and
   the instructions cause the processor to:
      monitor an amount of correction ($\varphi$) being applied to the DC power signal by the PFC circuitry, and identify the fault when both of the following conditions are satisfied together:
         the present input current exceeds the moving average by the threshold amount; and
         $\varphi$ is within a second threshold of zero degrees for a third threshold amount of time.

8. The non-transitory machine readable medium of claim 5,
   wherein the instructions cause the processor to:
      store measured values of the input current in a register, and
      determine the moving average of the input current by averaging the values stored in the register.

9. A method for fault detection in a power supply that converts an input power signal into a DC power signal for an electronic device, the method comprising:
   periodically measuring an input current being drawn from the input power signal;
   periodically determining a moving average of the input current;
   periodically comparing the moving average of the input current to the present input current; and
   identifying a fault in response to the present input current exceeding the moving average by a threshold amount; and shutting down supply of power to the electronic device responsive to identifying the fault.

10. The method of claim 9, comprising:
wherein identifying the fault in response to the present input current exceeding the moving average by the threshold amount includes identifying the fault responsive to the present input current exceeding the moving average by the threshold amount for longer than a specified amount of time or more than a secured number of times within a specified period.

11. The method of claim 9,
wherein the power supply includes power factor correction (PFC) circuitry that is configured to correct a power factor of the DC power signal,
the method comprises monitoring an amount of correction ($\varphi$) being applied to the DC power signal by the PFC circuitry, and
identifying the fault in response to the present input current exceeding the moving average by the threshold amount includes identifying the fault responsive to both of the following conditions being satisfied together:
  the present input current exceeds the moving average by the threshold amount; and
  $\varphi$ is within a second threshold of zero degrees for a third threshold amount of time.

12. The method of claim 9, comprising:
storing measured values of the input current in a register; and
determining the moving average of the input current by averaging the values stored in the register.

* * * * *